US010218465B2

(12) United States Patent
Swarts et al.

(10) Patent No.: US 10,218,465 B2
(45) Date of Patent: Feb. 26, 2019

(54) METHOD AND SYSTEM FOR MAXIMIZING CHANNEL BANDWIDTH WHILE EMPLOYING ERROR CONTROL CODING

(71) Applicant: Nextivity, Inc., San Diego, CA (US)

(72) Inventors: Francis Swarts, San Diego, CA (US); Andrew Christopher Du Preez, Poway, CA (US)

(73) Assignee: Nextivity, Inc., San Diego, CA (US)

( * ) Notice: Subject to any disclaimer, the term of this patent is extended or adjusted under 35 U.S.C. 154(b) by 0 days.

(21) Appl. No.: 15/201,158

(22) Filed: Jul. 1, 2016

(65) Prior Publication Data

US 2017/0005755 A1 Jan. 5, 2017

Related U.S. Application Data

(60) Provisional application No. 62/188,296, filed on Jul. 2, 2015.

(51) Int. Cl.
*H04L 1/00* (2006.01)
*H03M 13/09* (2006.01)
*H03M 13/19* (2006.01)

(52) U.S. Cl.
CPC .......... *H04L 1/0076* (2013.01); *H03M 13/09* (2013.01); *H03M 13/19* (2013.01); *H04L 1/0041* (2013.01)

(58) Field of Classification Search
None
See application file for complete search history.

(56) References Cited

U.S. PATENT DOCUMENTS

| | | | | |
|---|---|---|---|---|
| 8,984,097 B1* | 3/2015 | Shyam | ............ | G06F 17/30174 707/610 |
| 2008/0040644 A1* | 2/2008 | Spencer | ................ | H03M 13/09 714/758 |
| 2011/0310833 A1* | 12/2011 | Lee | ........ | H04L 1/1829 370/329 |
| 2013/0016655 A1* | 1/2013 | Heo | ........ | H04L 5/001 370/328 |
| 2015/0135042 A1* | 5/2015 | Im | ....... | G06F 11/1004 714/807 |

* cited by examiner

*Primary Examiner* — Daniel F. McMahon
(74) *Attorney, Agent, or Firm* — Mintz Levin Cohn Ferris Glovsky and Popeo, P.C.

(57) ABSTRACT

A system and method includes employing a cyclical redundancy check (CRC) code to information being transmitted on the channel, the CRC code including appending a single CRC code bit to the information, the single CRC code bit having a value of 0. The method further includes adding an error correcting code with a value of 0 to the information and to a plurality of error correcting code parity bits provided by the error correcting code. The method further includes transmitting, by the communication device, the information on the channel without the single CRC code bit, the additional information bit, and the error correcting code parity bits for being decoded and set by a receiver.

12 Claims, 3 Drawing Sheets

| Weight | CRC-11 0xEF7 | CRC-11 + H(31,26) |
|---|---|---|
| 0 | 1 | 1 |
| 1 | 0 | 0 |
| 2 | 0 | 0 |
| 3 | 0 | 0 |
| 4 | 0 | 0 |
| 5 | 0 | 0 |
| 6 | 202 | 202 |
| 7 | 0 | 0 |
| 8 | 1038 | 1038 |
| 9 | 0 | 0 |
| 10 | 3172 | 3172 |
| 11 | 0 | 0 |
| 12 | 5124 | 5124 |
| 13 | 0 | 0 |
| 14 | 4320 | 4320 |
| 15 | 0 | 0 |
| 16 | 1993 | 1993 |
| 17 | 0 | 0 |
| 18 | 492 | 492 |
| 19 | 0 | 0 |
| 20 | 36 | 36 |
| 21 | 0 | 0 |
| 22 | 6 | 6 |
| 23 | 0 | 0 |
| 24 | 0 | 0 |
| 25 | 0 | 0 |
| 26 |  | 0 |
| 27 |  | 0 |
| 28 |  | 0 |
| 29 |  | 0 |
| 30 |  | 0 |
| 31 |  | 0 |

FIG. 1

METHOD AND SYSTEM FOR MAXIMIZING CHANNEL BANDWIDTH WHILE EMPLOYING ERROR CONTROL CODING

CROSS-REFERENCE TO RELATED APPLICATION

This claims the benefit of U.S. Provisional Application Ser. No. 62/188,296, entitled "METHOD AND SYSTEM FOR MAXIMIZING CHANNEL BANDWIDTH WHILE EMPLOYING ERROR CONTROL CODING," filed on Jul. 2, 2015. The disclosures of the above-identified patent application are hereby incorporated by reference in their entirety.

TECHNICAL FIELD

The subject matter described herein relates to data communication systems, and more particularly to methods and systems for maximizing channel bandwidth of a communication system while employing error control coding.

BACKGROUND

Error control coding can be used in communication or data storage systems where there is a constraint on bandwidth or storage capacity that cannot easily be overcome by simply increasing the constrained resource. Error control coding typically involves taking a message consisting of k information bits/symbols and encoding them into n code bits/symbols, with n>k. The process can normally be achieved through an (n, k) block code of which many codes are well known, such as the binary Hamming and BCH codes, as well as the non-binary BCH and Reed-Solomon or RS codes.

The addition of the extra n–k bits/symbols to the k information bits/symbols that have to be transmitted, although critical to the functioning of the decoder for error-free recovery of the original information bits, conveys no additional information, thereby reducing the effective bandwidth of the channel. The effective rate of information transfer per transmitted code word is k/n with (n–k)/n representing the fraction of transmitted bits not conveying any additional information.

The encoding process produces the additional n–k bits. These additional bits are known as the parity bits of the code word and there typically exists $2^{n-k}$ unique parity patterns. For codes with k/n>0.5 there are typically multiple code words that can map to the same parity pattern. Typically, $2^{2k-n}$ code words will map to a specific parity pattern consisting of n–k bits.

What is needed is a system and method in which the encoding of information takes place in such a manner that for all the information sequences or messages of interest, code words get selected in such a manner that all have the exact same parity pattern, in order to utilize as many of the bits in a communication channel for information transfer as possible.

SUMMARY

This document presents a system and method in which the encoding of information takes place in such a manner that for all the information sequences or messages of interest, code words get selected in such a manner that all have the exact same parity pattern. The system and method therefore utilizes as many of the bits in a communication channel for information transfer as possible.

In one aspect, a data communication system is presented that communicates data on a channel executes a method for maximizing channel bandwidth while employing error control coding. The method includes employing, by a communication device of the data communication system associated with the channel, a cyclical redundancy check (CRC) code to information being transmitted on the channel, the CRC code including appending a single CRC code bit to the information, the single CRC code bit having a value of 0. The method further includes adding, by the communication device, an error correcting code to the information, the adding of the error correcting code including adding an additional information bit with a value of 0 to a plurality of error correcting code parity bits provided by the error correcting code to the information, the plurality of error correcting code parity bits also having a value of 0. The method further includes transmitting, by the communication device, the information on the channel without the single CRC code bit, the additional information bit, and the error correcting code parity bits.

In other aspects, the method further includes setting, by a receiving device of the data communication system, the non-transmitted single CRC code bit, additional information bit, and error correcting code parity bits to 0. The method further includes decoding, by the receiving device, the transmitted information, the decoding including decoding the information with the single CRC code bit, the additional information bit, and the error correcting code parity bits that have been set to 0.

Implementations of the current subject matter can include, but are not limited to, systems and methods, as well as articles that comprise a tangibly embodied, non-transitory machine-readable medium operable to cause one or more machines (e.g., computers, etc.) to result in operations described herein. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to an enterprise resource software system or other business software solution or architecture, it should be readily understood that such features are not intended to be limiting. The claims that follow this disclosure are intended to define the scope of the protected subject matter.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings, FIG. 1 is a table illustrating the results of error control coding in accordance with implementations described herein.

When practical, similar reference numbers denote similar structures, features, or elements.

DETAILED DESCRIPTION

To address the aforementioned and potentially other issues with currently available solutions, a system and method is described, in which the encoding of information takes place in such a manner that for all the information sequences or messages of interest, code words get selected in a way that all have the exact same parity pattern. The system and method therefore utilizes as many of the bits in a communication channel for information transfer as possible.

Figure 2:
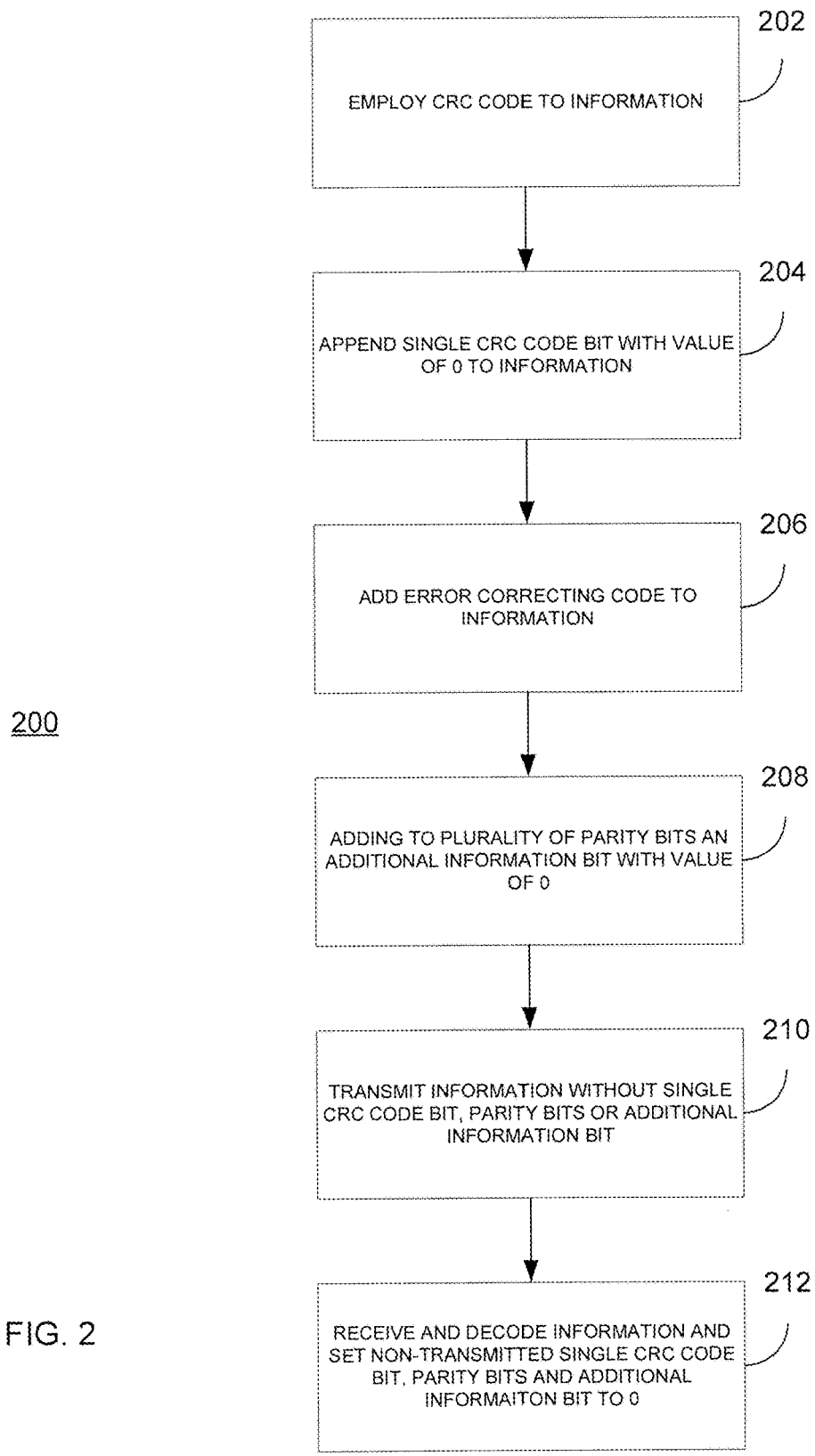
FIG. 2 is a flowchart of a method for maximizing channel bandwidth while employing error control coding.

In accordance with some exemplary implementations of a system and method, and as shown in the flowchart depicted in FIG. 2, at step 202, 14 information bits are protected by a cyclical redundancy check (CRC) encoding, and in particular CRC-11 and, due to the nature of the channel across which the information is conveyed, having an additional single bit of error correction capability will correct transmission errors in approximately 3.1% of transmissions for code words of length 31 bits, the rate at which single transmission errors are likely to occur in a random error environment with a bit error probability of 1e−3.

The CRC encoding employs a (25,14) code which is extended to a (26,14) code by appending a single bit with value 0, at step 204. For the single error protection that is desired, a (31,26) error correcting code, such as a Hamming code, is employed at step 206. In some implementations, a CRC/Hamming encoding scheme achieves exactly what is proposed above in that all of the $2^{14}$ CRC code words that are encoded by the Hamming code, always have 5 parity bits set to zero. As part of the Hamming encoding process, at step 208, an additional information bit is set to zero as well. The fact that these six bits are always fixed at zero obviates their transmission at step 210, and these can always be set to zero in the decoding process at the receiver, in effect always receiving these error-free, at step 212.

Not transmitting 6/31 bits leads to ~20% improvement in bandwidth utilization of the channel while still retaining the single error correcting capability of the Hamming code. The fact that only 25 of 31 code bits are transmitted also reduces the likelihood of having single transmission errors to ~2.4% of transmissions. The CRC-11 code employed in this case utilizes the generator polynomial 0xEF7 (binary [111011110111]). The following table shows the weight distribution for the CRC-11 as well as the CRC-11/Hamming (31,26) combination. Note that in both cases the weight distributions are identical, implying that for the Hamming code the parity bits are always zero.

The techniques described above can be employed in a wireless communication system having a very tight constraint on transmission bandwidth and message latency. By applying these techniques, more system messages can be made available in a single transmission, seeing that fewer channel bits now have to be consumed by a single message, and allowing for a more compact arrangement of multiple messages. By implementing these techniques, potential complications that come about as a result of making less efficient use of bandwidth/channel bits are avoided, such as having to partition the transmission of a single message between multiple transmissions and re-assembling partitioned messages at the receiver.

Figure 3:
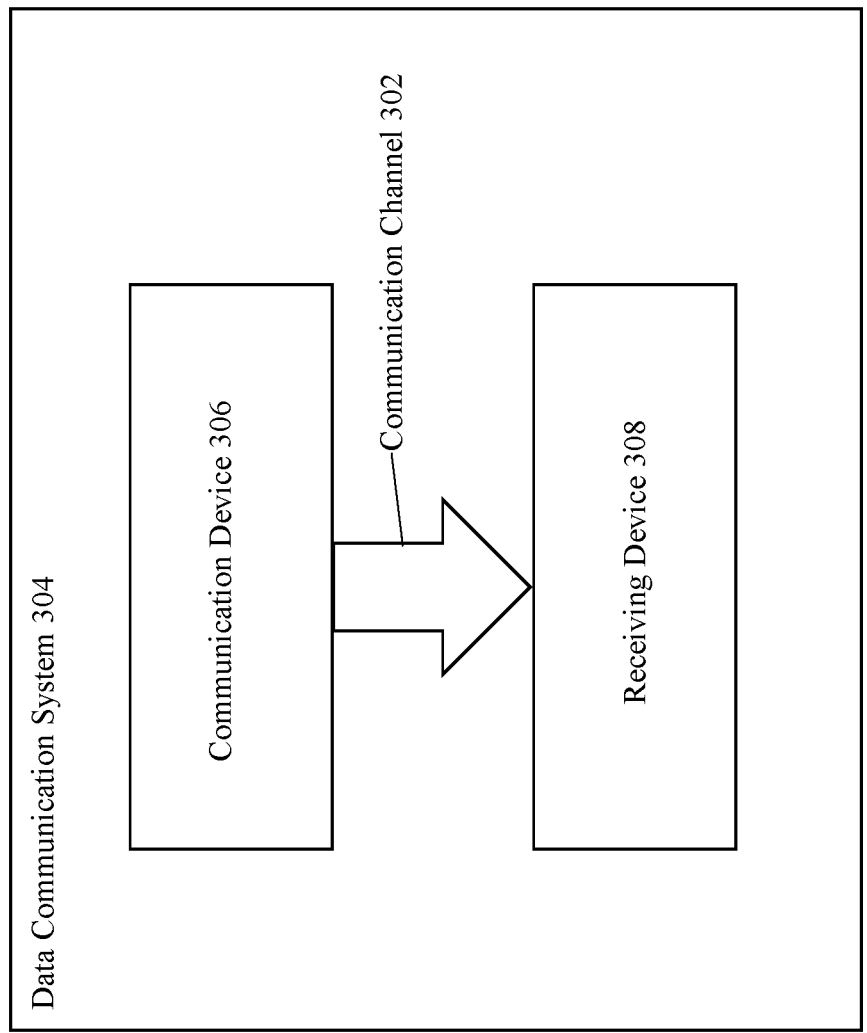
FIG. 3 is a block diagram illustrating features of a data communication system.

FIG. 3 illustrates an example data communication system 304 that maximizes channel bandwidth while employing error control coding. The data communication system 304 includes a communication device 306 and a receiving device 308. The communication device 306 can be associated with a wireless channel 302 for communicating information on the wireless channel 302. The communication device 206 can apply a cyclical redundancy check (CRC) code to information being transmitted on the wireless channel, employing the CRC code including a single CRC code bit appended to the information, the single CRC code bit having a value of 0; add an error correcting code to the information, the adding of the error correcting code including adding an additional information bit with a value of 0 to a plurality of error correcting code parity bits provided by the error correcting code to the information, the plurality of error correcting code parity bits also having a value of 0; transmit the information on the channel without the single CRC code bit, the additional information bit, and the error correcting code parity bits. The receiving device 308 can be associated with the communication channel 302 for receiving the transmitted information. The receiving device 308 can set the non-transmitted single CRC code bit, additional information bit, and error correcting code parity bits to 0; and decode the transmitted information, the decoding including decoding the information with the single CRC code bit, the additional information bit, and the error correcting code parity bits that have been set to 0.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT), a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. In a data communication system that communicates data on a wireless channel, a method for maximizing channel bandwidth while employing error control coding, the method comprising:
    applying, by a communication device of the data communication system associated with the wireless channel, a cyclical redundancy check (CRC) code to information being transmitted on the channel;
    extending the CRC code to include a single CRC code bit appended to the CRC code, the single CRC code bit having a value of 0;
    adding, by the communication device and using the extended CRC code, an error correcting code to the information, the adding of the error correcting code including adding an additional information bit with a value of 0 to a plurality of error correcting code parity bits provided by the error correcting code to the information, the plurality of error correcting code parity bits also having a value of 0; and
    transmitting, by the communication device, the information including the CRC code on the wireless channel without the single CRC code bit, the additional information bit, and the error correcting code parity bits;
    receiving, by a receiving device of the data communication system, the transmitted information;
    setting, by the receiving device, each of the single CRC code bit that is not transmitted, additional information bit, and error correcting code parity bits to 0; and
    decoding, by the receiving device, the transmitted information, the decoding including decoding the information with the single CRC code bit, the additional information bit, and the error correcting code parity bits that have been set to 0.

2. The method in accordance with claim 1, wherein the CRC code is CRC-11.

3. The method in accordance with claim 1, wherein the error correction code is a Hamming code.

4. The method in accordance with claim 3, wherein the Hamming code is a (31,26) Hamming code.

5. A data communication system that maximizes channel bandwidth while employing error control coding, the data communication system comprising:
    a communication device associated with a wireless channel for communicating information on the wireless channel, the communication device being configured to:
        apply a cyclical redundancy check (CRC) code to information being transmitted on the wireless channel,
        extend the CRC code to include a single CRC code bit appended to the CRC code, the single CRC code bit having a value of 0;
        add, using the extended CRC code, an error correcting code to the information, the adding of the error correcting code including adding an additional information bit with a value of 0 to a plurality of error correcting code parity bits provided by the error correcting code to the information, the plurality of error correcting code parity bits also having a value of 0; and
        transmit the information including the CRC code on the channel without the single CRC code bit, the additional information bit, and the error correcting code parity bits; and
    a receiving device associated with the channel for receiving the transmitted information, the receiving device being configured to:
        receive the transmitted information;
        set the non-transmitted single CRC code bit, additional information bit, and error correcting code parity bits to 0; and
        decode the transmitted information, the decoding including decoding the information with the single CRC code bit, the additional information bit, and the error correcting code parity bits that have been set to 0.

6. The data communication system in accordance with claim 5, wherein the CRC code is CRC-11.

7. The data communication system in accordance with claim 5, wherein the error correction code is a Hamming code.

8. The data communication system in accordance with claim 7, wherein the Hamming code is a (31,26) Hamming code.

9. The method in accordance with claim 1, further comprising:
   selecting code words such that all parity bit patterns are the same.

10. The method in accordance with claim 1, wherein a weight distribution of the CRC code and a weight distribution of the error correcting code are identical.

11. The data communication system in accordance with claim 5, wherein the transmitter is configured to:
   select code words such that all parity bit patterns are the same.

12. The data communication system in accordance with claim 5, wherein a weight distribution of the CRC code and a weight distribution of the error correcting code are identical.

* * * * *